United States Patent
Krishnan et al.

(10) Patent No.: US 6,770,937 B1
(45) Date of Patent: Aug. 3, 2004

(54) PHOTOCONDUCTIVE THIN FILM FOR REDUCTION OF PLASMA DAMAGE

(75) Inventors: Anand Krishnan, Richardson, TX (US); Srikanth Krishnan, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 132 days.

(21) Appl. No.: 10/409,560

(22) Filed: Apr. 8, 2003

(51) Int. Cl.[7] .............................................. H01L 23/62
(52) U.S. Cl. ..................... 257/356; 257/356; 257/316
(58) Field of Search ................................ 257/356, 316, 257/357, 390, 300, 296; 438/640, 647

(56) References Cited

U.S. PATENT DOCUMENTS 6,277,723 B1 * 8/2001 Shih et al. .................. 438/597
6,469,342 B1 * 10/2002 Kuo et al. ................... 257/316

* cited by examiner

*Primary Examiner*—Hoai Ho
*Assistant Examiner*—Thinh Nguyen
(74) *Attorney, Agent, or Firm*—Peter K. McLarty; W. James Brady, III; Frederick J. Telecky, Jr.

(57) ABSTRACT

A semiconductor device (200) that includes a semiconductor substrate (210), semiconductor features (230, 235, 240, 260) located thereover and an insulating photoconductive layer (270) coupling the semiconductor features (230, 235, 240, 260). The photoconductive layer (270) is configured to provide conductivity between the semiconductor features (230, 235, 240, 260) in a presence of a plasma.

28 Claims, 6 Drawing Sheets

PHOTOCONDUCTIVE THIN FILM FOR REDUCTION OF PLASMA DAMAGE

TECHNICAL FIELD OF THE INVENTION

The present invention is directed, in general, to semiconductor devices and, more specifically, to a semiconductor device having reduced susceptibility to plasma damage.

BACKGROUND OF THE INVENTION

The majority of the present day processes used for silicon fabrication, particularly after forming the transistor, have shifted to plasma processes for various beneficial reasons. For example, plasma processes give better deposition and deposition control in structures having high aspect ratios. Lower thermal budgets can also be achieved by using plasma deposition processes. However along with these benefits, plasma processes also have undesirable aspects associated with their use.

When a wafer is exposed to a plasma, it is exposed to a high energy environment containing high energy ions, electrons and neutral radicals. Due to the presence of these ions and electrons, a current flow can be established in the wafer and thus can be established in the transistor devices located on the wafer. If the current flow becomes significant enough, current can flow through a gate dielectric and stress the gate dielectric. If the gate dielectric becomes damaged as a result of this parasitic current flow, it can produce an undesirable number of inoperative or damaged devices, thereby ultimately increasing yield loss or decreasing performance reliability.

To lessen the affect of this undesired current flow, conventional techniques have included connecting electrodes to the body (substrate) through a reverse-biased diode. Such diodes have mitigated the effect of the current developing process. Moreover, the presence of this diode does not affect normal transistor operation, because in the ON state of the transistor, the diode is reverse-biased and the maximum current between the gate and the body is the diode leakage current. In contrast, the diode leakage current is much higher during illumination, which happens during any plasma process. Hence, the undesired current flow through the gate electrode and dielectric is minimal during fabrication.

However, the conventional use of diodes to mitigate the effect of antenna charging is not desirable in all situations. For example, diodes incorporated into transistor arrays consume significant wafer area/volume, thereby decreasing production yield. Such additional consumption of wafer space can also adversely affect performance as a result of the additional capacitance of the diodes (e.g., clock speed can undesirably decrease).

Accordingly, what is needed in the art is a semiconductor device that does not suffer from the deficiencies found in the prior art.

SUMMARY OF THE INVENTION

To address the above-discussed deficiencies of the prior art, the present invention provides a semiconductor device that includes a semiconductor substrate, semiconductor features located thereover and an insulating photoconductive layer coupling the semiconductor features. The photoconductive layer is configured to provide conductivity between the semiconductor features when exposed to plasma, and at least partially isolate the semiconductor features in the absence of the plasma.

In another embodiment, the present invention provides a method of manufacturing a semiconductor device that includes forming semiconductor features over a semiconductor substrate and coupling the semiconductor features via an insulating photoconductive layer. As with the embodiment discussed above, the photoconductive layer is configured to provide conductivity between the semiconductor features when exposed to plasma.

In yet another embodiment, the present invention provides an integrated circuit that includes a semiconductor substrate, a plurality of transistors having semiconductor features located over the substrate and an insulating photoconductive layer coupling the semiconductor features. Once again, the photoconductive layer is configured to provide conductivity between the semiconductor features when exposed to a plasma environment.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
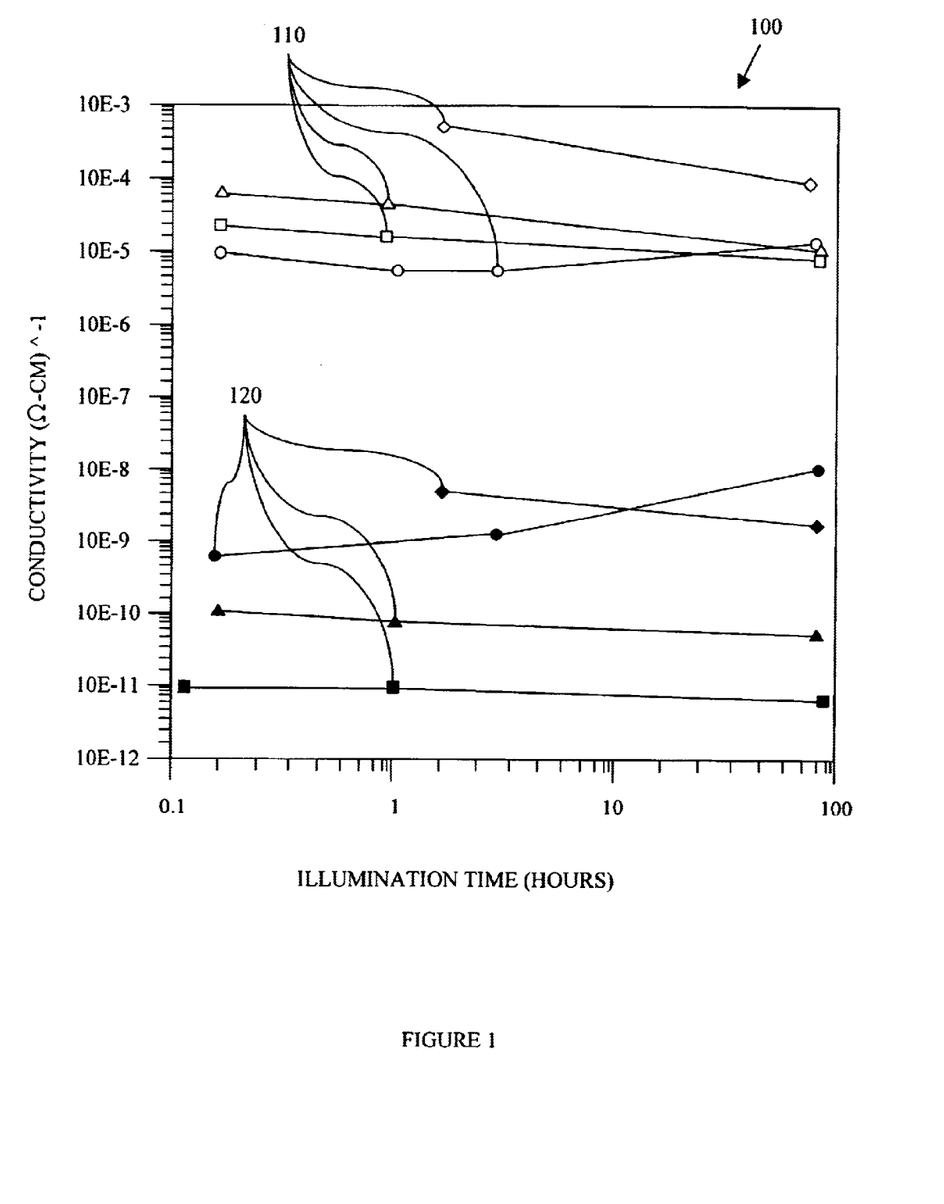
FIG. 1 illustrates a chart depicting illumination conductivities and dark conductivities of several photoconductive materials.

Referring initially to FIG. 1, illustrated is a chart 100 depicting illumination conductivities 110 and dark conductivities 120 of several photoconductive materials. The horizontal axis reflects illumination time (in units of hours), and the vertical axis reflects conductivity (in units of S/cm, or ($\Omega$-cm)$^{-1}$). Those skilled in the art understand that photoconductive materials are those that exhibit a conductivity that depends on the intensity of incident, light-radiant energy (usually infrared transmission or visible light). For example, as shown in FIG. 1, the illumination conductivities 110 (or the "light conductivities") range between about $10^{-6}$ ($\Omega$-cm)$^{-1}$ and about $10^{-3}$ ($\Omega$-cm)$^{-1}$, and the dark conductivities range between about $10^{-12}$ ($\Omega$-cm)$^{-1}$ and about $10^{-8}$ ($\Omega$-cm)$^{-1}$.

As is well known, semiconductor materials are generally photoconductive. In most cases, the greater the radiant energy of a specific wavelength that strikes the surface, the higher the conductivity of the photoconductive material becomes, up to a certain maximum. Typical photoconductive substances include doped and un-doped germanium, gallium, selenium, and silicon (crystalline and amorphous). Other common photoconductive materials include metal oxides and sulfides.

Figure 2:
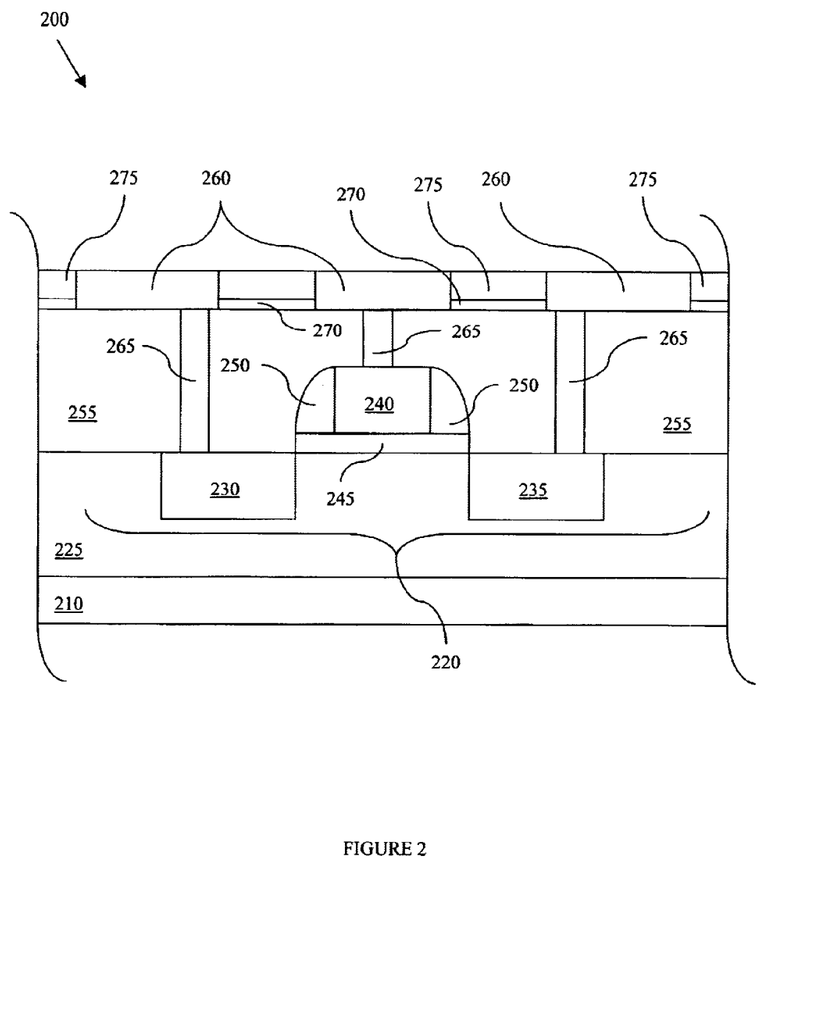
FIG. 2 illustrates a sectional view of an embodiment of a semiconductor device constructed according to the principles of the present invention.

Turning to FIG. 2, illustrated is a sectional view of an embodiment of a semiconductor device 200 constructed according to the principles of the present invention. The semiconductor device 200 includes a semiconductor substrate 210 having a semiconductor element 220 formed thereover.

The semiconductor element 220 includes several features of conventional composition and construction, including a body 225 (also known as a substrate, well or tub), a source 230 and drain 235 formed in the body 225, a gate 240 between the source 230 and drain 235, a gate oxide 245 between the gate 240 and the substrate 210, and spacers 250 on opposing sides of the gate 240. A pre-metal dielectric layer 255 is formed over the source 230, drain 235 and gate 240. Metal features 260, which may serve as metal pads for vias or may be interconnect traces, are preferably formed over the pre-metal dielectric layer 255 and connected to the source 230 and drain 235 by vias 265. The metal features 260 may comprise a portion of a first metallization layer. Those skilled in the art will recognize that the above-described features of the semiconductor element 220 are typical, and may be of conventional composition and construction.

By referring to elements as being formed over the substrate 210 (e.g., the source 230, drain 235, gate 240 and metal features 260), it is intended that such features may be formed (1) within the substrate 210, (2) on and in direct contact with the substrate 210, or (3) over the substrate 210 but not in direct contact therewith; that is, there may be an interposing layer between the substrate 210 and the subject overlaying layer. For example, the source 230 and drain 235 may be formed within the substrate 210, the gate oxide 245 and vias 265 may be formed on and in direct contact with the substrate 220, and the gate 240 and metal features 260 may be formed over and distal from the substrate 210, yet all of these features are considered to be formed over the substrate 210 according to the principles of the present invention.

The semiconductor device 200 also includes a photoconductive layer 270 coupling two or more of the typical semiconductor features described above. For example, as in the embodiment shown in FIG. 2, the photoconductive layer 270 may couple the metal features 260 formed over the pre-metal dielectric layer 255. In this manner, the photoconductive layer 270 may be configured to provide conductivity between the metal features 260 during a plasma etching or deposition step in the manufacturing process. Moreover, because the metal features 260 are electrically coupled to the source 230, drain 235 and gate 240 by the vias 265, the photoconductive layer 270 also electrically couples the source 230, drain 235 and gate 240 when the semiconductor device 200 is exposed to a plasma environment. Thereby, the photoconductive layer 270, the source 230, drain 235 and gate 240 are all at substantially the same voltage potential during the plasma processing step. Accordingly, because the photoconductive layer 270 effectively shorts the metal features 260, current flow is not conducted through the source 230, drain 235 or gate 240, and the damage conventionally caused by the potential difference across the gate oxide 245 is substantially reduced or eliminated.

After the fabrication process is completed and the semiconductor device 200 is no longer exposed to a plasma environment, the, photoconductive layer 270 is no longer conductive. In contrast, the photoconductive layer 270 will be at least semi-insulating, such that the metal features 260 are no longer electrically coupled. That is, while the metal features 260 may remain mechanically coupled after the semiconductor device 200 is removed from the plasma environment, the reversion of the photoconductive layer 270 to its dark conductivity in the absence of the plasma isolates the metal features 260 from one another. In this manner, the photoconductive layer 270 does not alter the operation of the semiconductor element 220 or device 200, but merely complements the isolation structure between the metal features 260 (such as an interlevel dielectric layer 275) as additional dielectric material.

The photoconductive layer 270 preferably comprises material having a band gap ranging between about 1.2 eV and about 6.0 eV. In a more specific embodiment, the band gap of the photoconductive layer 270 may range between about 1.7 eV and about 2.1 eV. One such material is amorphous silicon. Of course, it should be understood that the present invention does not limit the composition of the photoconductive layer 270 to amorphous silicon. For example, the photoconductive layer 270 may comprise boron nitride, gallium nitride and/or silicon carbide. In one embodiment, the photoconductive layer 270 may comprise a silicon:germanium:carbon alloy, a silicon:germanium:carbon:hydrogen alloy, a silicon:germanium:carbon:nitrogen alloy, cadmium telluride and/or its alloys with indium or zinc, indium phosphide, and/or complex polymers. Moreover, the photoconductive layer 270 may have a dark conductivity ranging between about $10^{-11}$ ($\Omega$-cm)$^{-1}$ to about $10^{-10}$ ($\Omega$-cm)$^{-1}$ and an illumination conductivity ("light" conductivity) of about $10^{-5}$ ($\Omega$-cm)$^{1}$.

In one embodiment, the photoconductive layer 270 may have a thickness ranging between about 4 nm and about 15 nm. In a more specific embodiment, the photoconductive layer 270 may have a thickness ranging between about 6 nm and about 10 nm. Of course, other thicknesses are within the scope of the present invention. However, as the thickness of the photoconductive layer 270 decreases, its continuity may be threatened by insufficiencies inherent to the particular process employed to deposit or otherwise fabricate the photoconductive layer 270. In such embodiments, the photoconductive layer 270 may ineffectively couple the appropriate features of the semiconductor device 200 when exposed to a plasma environment. Such a lack of continuity of the photoconductive layer 270 may allow a voltage potential to develop across the gate oxide 245.

In certain other embodiments, the thickness of the photoconductive layer 270 may also exceed 15 nm. In that regard, the photoconductive layer 270 may also function as an etch stop, in addition to any etch stop material that is already present, between the interlevel dielectric layer 275 and the intermetal dielectric layer 255. However, a corresponding increase in current leakage between features of the semiconductor device 200 may accompany an increase in the thickness of the photoconductive layer 270. That is, when the semiconductor device 200 is operated in the absence of a plasma environment, the photoconductive layer 270 may be only semi-insulative, such that the photoconductive layer 270 may be at least somewhat conductive. Accordingly, in one embodiment of the present invention the thickness of the photoconductive layer 270 may be determined based on the maximum allowable leakage between features of the semiconductor device 200.

Figure 3:
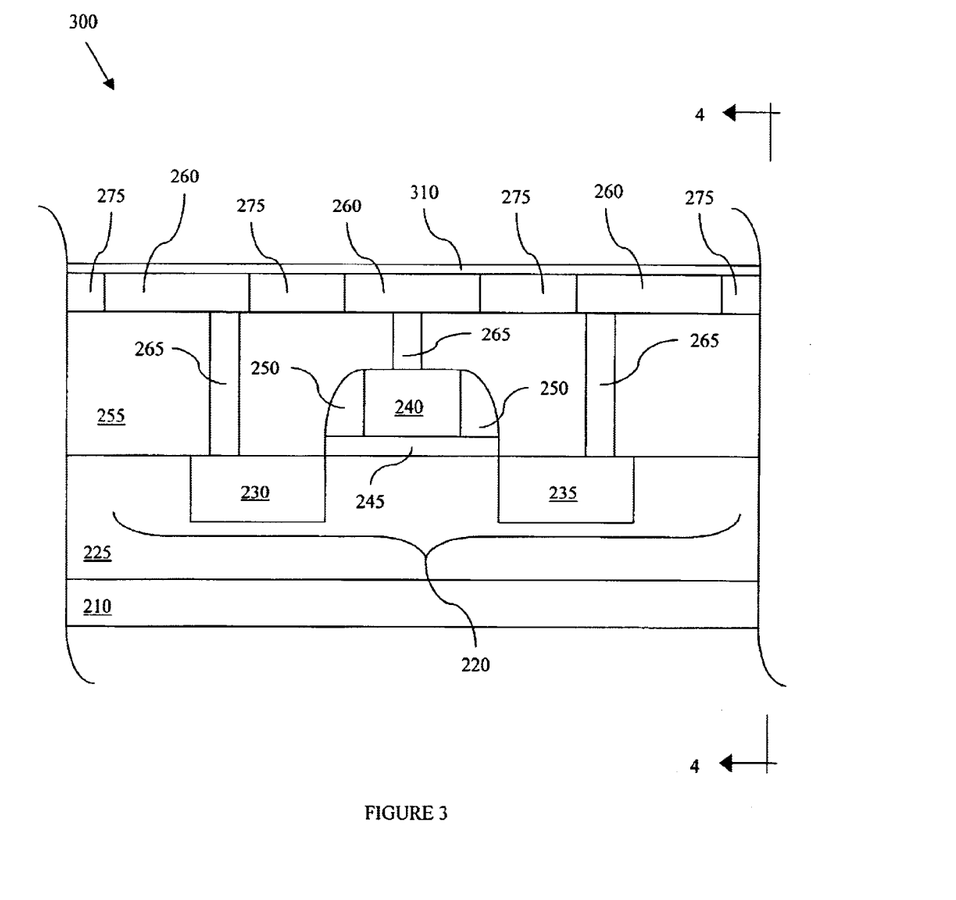
FIG. 3 illustrates a sectional view of another embodiment of a semiconductor device constructed according to the principles of the present invention.

Turning to FIG. 3 with continued reference to FIG. 2, illustrated is a sectional view of another embodiment of a semiconductor device 300 constructed according to the principles of the present invention. The, semiconductor device 300 may be substantially similar to the semiconductor device 200 shown in FIG. 2. Accordingly, reference numbers for features of the semiconductor device 300, which may be similar to corresponding features of the semiconductor device 200 shown in FIG. 2, have been maintained in FIG. 3, where possible.

As in the embodiment illustrated in FIG. 3, a photoconductive layer 310 may be formed over the metal features 260, thereby mechanically coupling the metal features 260. The photoconductive layer 310 may be at least similar in composition and construction to the photoconductive layer 270 shown in FIG. 2. Accordingly, the photoconductive layer 310 may electrically couple the metal features 260 when the semiconductor device 300 is exposed to a plasma environment, and may isolate the metal features 260 in the absence of plasma. Thus, the photoconductive layer 310 may substantially reduce or eliminate the build-up of voltage potential across the gate oxide 245 when the semiconductor device 300 is exposed to a plasma environment. Furthermore, the photoconductive layer 310 may cooperate with the interlevel dielectric layer 275 and intermetal dielectric layer 255 to electrically isolate the metal features 260 in the absence of a plasma.

Figure 4:
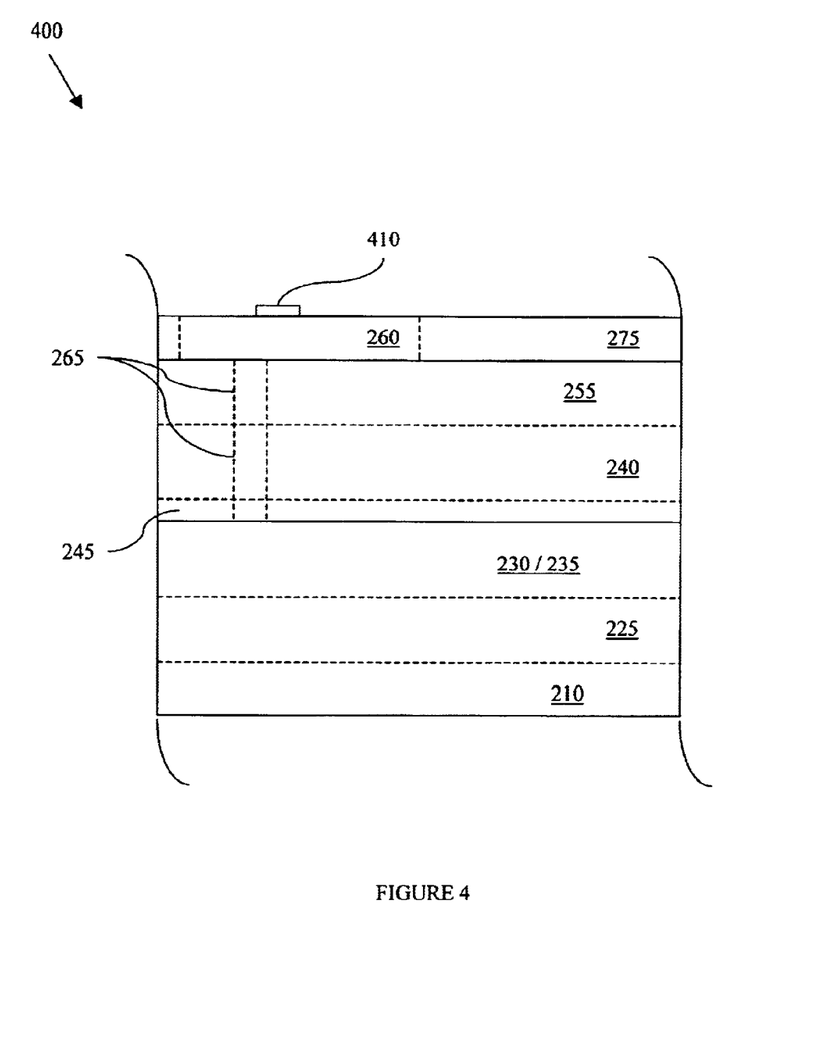
FIG. 4 illustrates a sectional view of yet another embodiment of a semiconductor device constructed according to the principles of the present invention.

Turning briefly to FIG. 4 with continued reference to FIG. 3, illustrated is a sectional view of another embodiment of a semiconductor device 400 constructed according to the principles of the present invention. The semiconductor device 400 may be substantially similar to the semiconductor device 300 shown in FIG. 3. In fact, the sectional view of the semiconductor device 400 shown in FIG. 4 may correspond to a sectional view of the semiconductor device 300 in the direction of the arrows shown in FIG. 3.

In the embodiment illustrated in FIG. 4, the photoconductive layer 310 of FIG. 3 has been patterned to form a patterned photoconductive layer 410. The patterned photoconductive layer 410 may cover only a portion of the metal features 260, whereas the photoconductive layer 310 of FIG. 3 may completely cover metal features 260.

By patterning the photoconductive layer 310 shown in FIG. 3 to form the patterned photoconductive layer 410 shown in FIG. 4, the current leakage between the metal features 260 may be further decreased during operation of the semiconductor device 400. That is, because the patterned photoconductive layer 410 is only semi-insulating, the photoconductive layer 410 may remain somewhat conductive even in the absence of a plasma. Therefore, it may be desirable to limit the physical dimensions of the photoconductive layer 410 to achieve a corresponding decrease in its conductivity. Accordingly, in one embodiment, the patterned photoconductive layer 410 may be configured to be as small as possible while still providing a continuous current path between the metal features 260 when the semiconductor device 400 is, exposed to a plasma environment.

Figure 5:
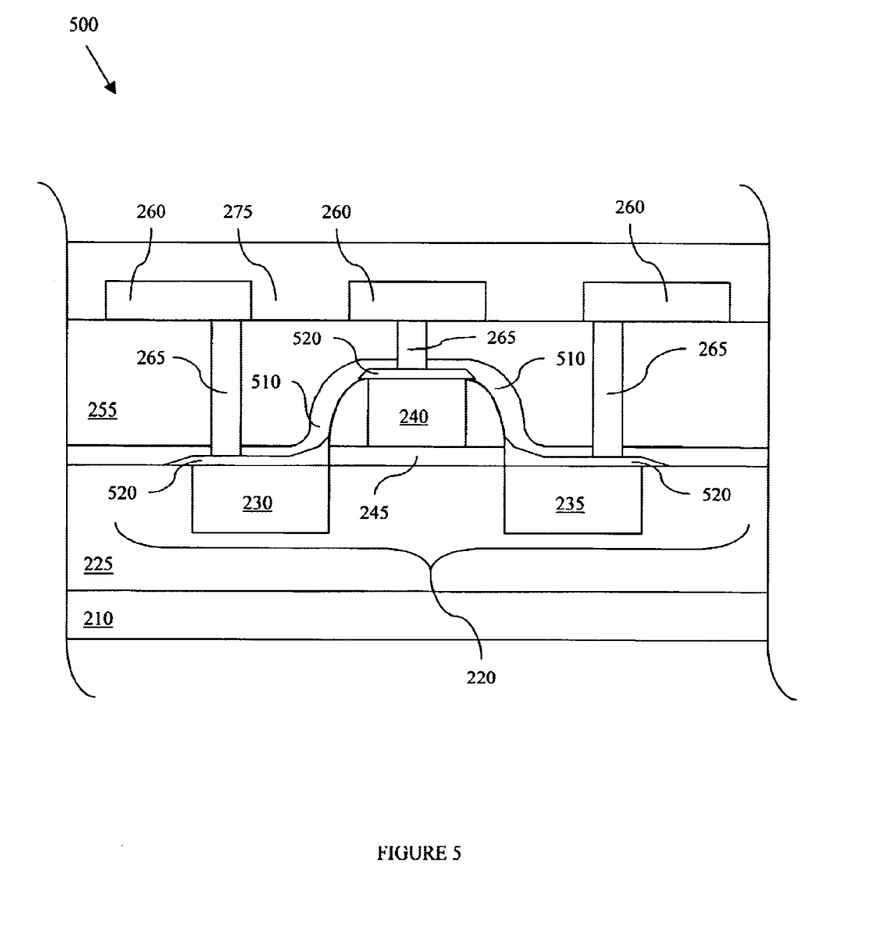
FIG. 5 illustrates a sectional view of yet another embodiment of a semiconductor device constructed according to the principles of the present invention.

Turning now to FIG. 5 with continued reference to FIG. 2, illustrated is a sectional view of yet another embodiment of a semiconductor device 500 constructed according to the principles of the present invention. The semiconductor device 500 may be substantially similar to the semiconductor device 200 shown in FIG. 2. Accordingly, reference numbers for features of the semiconductor device 500 which may be similar to corresponding features of the semiconductor device 200 shown in FIG. 2 have been maintained in FIG. 5, where possible.

As shown in the embodiment of FIG. 5, a photoconductive layer 510 may be formed over the source 230, drain 235 and gate 240, thereby mechanically coupling the source 230, drain 235 and gate 240. The photoconductive layer 510 may be at least similar in composition and construction to the photoconductive layer 270 shown in FIG. 2, thereby preventing the build-up of a voltage potential across the gate oxide 245 during exposure to plasma during fabrication and isolating the source 230, drain 235 and gate 240 in the absence of plasma during operation.

The semiconductor device 500 may also include a silicide layer 520 formed between the photoconductive layer 510 and the source 230, drain 235 and/or gate 240. However, the silicide layer 520 is not a continuous layer, and does not mechanically couple the source 230, drain 235 or gate 240. Those skilled in the art understand that the silicide layer 520 may be of conventional composition and construction, as typically employed to improve electrical contact between the vias 265 and the source 230, drain 235 and gate 240. Therefore, as shown in FIG. 5, the vias 265 preferably extend through the photoconductive layer 510 to directly contact the silicide layer 520. Accordingly, the photoconductive layer 510 may be patterned by the same lithographic step employed to etch the vias 265 in the intermetal dielectric layer 255.

The embodiment shown in FIG. 5 may be advantageous over other embodiments of the present invention, depending on the design or application. That is, some embodiments of the present invention may not include vias 265 extending from each of the source 230, drain 235 and gate 240 to an overlying metal feature 260. In such embodiments, a photoconductive layer overlying or interposing the metal features 260 (such as the photoconductive layer 270 shown in FIG. 2) may not electrically couple the source 230, drain 235 and gate 240, such that a voltage potential may develop across the gate oxide 245 during fabrication. However, because the photoconductive layer 510 shown in FIG. 5 is formed directly over the source 230, drain 235 and gate 240 or the silicide layer 520, the photoconductive layer 510 may electrically couple the source 230, drain 235 and gate 240 (in the presence of a plasma) regardless of the existence of vias 265 contacting the source 230, drain 235 and gate 240.

Figure 6:
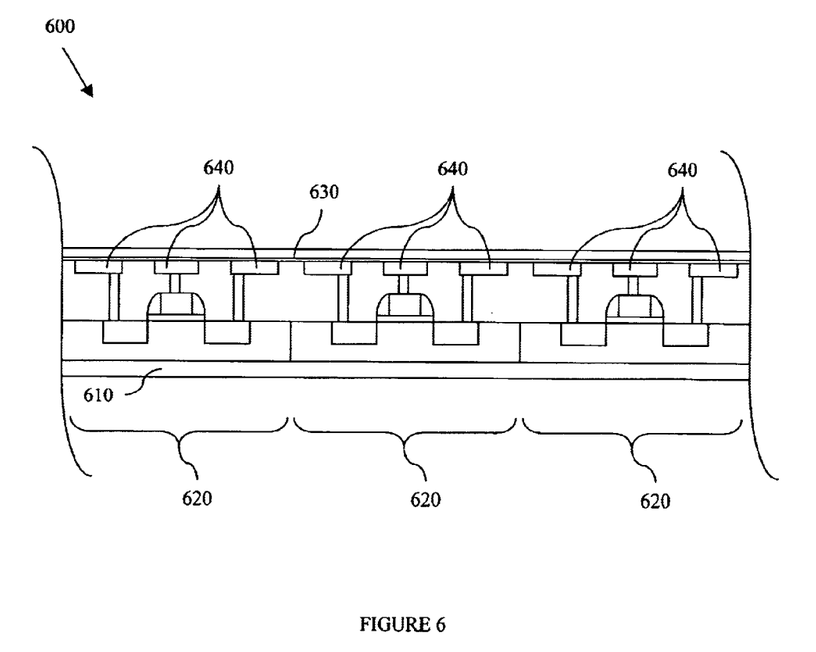
FIG. 6 illustrates a sectional view of an embodiment of an integrated circuit constructed according to the principles of the present invention.

Turning briefly to FIG. 6, illustrated is a sectional view of an embodiment of an integrated circuit 600 constructed according to the principles of the present invention. The integrated circuit 600 includes a semiconductor substrate 610 and a plurality of transistors 620. Each of the plurality of transistors 620 may be similar to the semiconductor element 220 shown in FIGS. 2–4. Accordingly, each of the transistors 620 may include semiconductor features formed over the substrate 610, such as the source 230, drain 235, gate 240 and metal features 260 shown in FIGS. 2–4.

The integrated circuit 600 also includes an insulating photoconductive layer 630. The photoconductive layer 630 may be at least similar in composition and construction to the photoconductive layer 270 shown in FIG. 2. The photoconductive layer 630 couples two or more of the semiconductor features of the transistors 620. For example, in the embodiment shown in FIG. 6 the photoconductive layer 630 couples metal features 640 formed as part of a first metal layer over the transistors 620. Accordingly, the photoconductive layer 630 provides conductivity between the semiconductor features (such as the metal features 640) when the integrated circuit 600 is exposed to a plasma environment. However, the photoconductive layer 630 also isolates the semiconductor features in the absence of plasma. Of course, it should be understood that while only one metal layer is shown, the integrated circuit 600 may include multiple metal levels. Each metal level may or may not have its own photoconductive layer 630.

Thus, the present invention presents the concept of forming a thin layer or film of photoconductive material over one or more existing layers in a semiconductor device. By integrating the photoconductive film, the voltage potential across the gate oxide can be substantially reduced or eliminated during fabrication of the semiconductor device. Moreover, the photoconductive film is very thin, having very little impact on the overall size of the semiconductor device. Furthermore, the photoconductive film may be easily integrated into existing fabrication procedures. That is, the photoconductive film of the present invention requires only a single additional deposition step, and may be deposited or otherwise formed with conventional procedures and equipment. In addition, the photoconductive film may be implemented without additional etching steps or lithographic masks or reticles.

Although the present invention has been described in detail, those skilled in the art should understand that they can make various changes, substitutions and alterations herein without departing from the spirit and scope of the invention in its broadest form.

What is claimed is:

1. A semiconductor device, comprising:
   semiconductor features located over a semiconductor substrate; and
   an insulating photoconductive layer coupling said semiconductor features, said photoconductive layer configured to provide conductivity between said semiconductor features in a presence of a plasma.

2. The semiconductor device as recited in claim 1 wherein a thickness of said photoconductive layer ranges from about 15 nm to about 4 nm.

3. The semiconductor device as recited in claim 1 wherein said semiconductor features are a gate, source and drain.

4. The semiconductor device as recited in claim 3 wherein a silicide layer is located between said photoconductive layer and said source and drain.

5. The semiconductor device as recited in claim 1 wherein said semiconductor features are metal features on a metal level of said semiconductor device.

6. The semiconductor device as recited in claim 1 wherein said photoconductive layer has a band gap ranging from about 1.2 eV to about 6.0 eV.

7. The semiconductor device as recited in claim 1 wherein said photoconductive layer comprises amorphous silicon.

8. The semiconductor device as recited in claim 1 wherein said photoconductive layer comprises one selected from the group comprising:
   gallium nitride,
   boron nitride, and
   silicon carbide.

9. The semiconductor device as recited in claim 1 wherein said photoconductive layer has a dark conductivity ranging from about $10^{-11}$ $(\Omega\text{-cm})^{-1}$ to about $10^{-10}$ $(\Omega\text{-cm})^{-1}$ and an illumination conductivity of about $10^{-5}$ $(\Omega\text{-cm})^{-1}$.

10. A method of manufacturing a semiconductor device, comprising:
    forming semiconductor features over a semiconductor substrate; and
    coupling said semiconductor features via an insulating photoconductive layer, said photoconductive layer configured to provide conductivity between said semiconductor features in a presence of a plasma.

11. The method as recited in claim 10 wherein a thickness of said photoconductive layer ranges from about 15 nm to about 4 nm.

12. The method as recited in claim 10 wherein said forming said semiconductor features includes forming a gate, source and drain.

13. The method as recited in claim 12 further comprising forming a silicide layer between said photoconductive layer and said source and drain.

14. The method as recited in claim 10 wherein said forming said semiconductor features includes forming metal features on a metal level of said semiconductor device.

15. The method as recited in claim 10 wherein said photoconductive layer has a band gap ranging from about 1.2 eV to about 6.0 eV.

16. The method as recited in claim 10 wherein said photoconductive layer comprises amorphous silicon.

17. The method as recited in claim 10 wherein said photoconductive layer comprises one selected from the group comprising:
    gallium nitride,
    boron nitride, and
    silicon carbide.

18. The method as recited in claim 10 wherein said photoconductive layer has a dark conductivity ranging from about $10^{-11}$ $(\Omega\text{-cm})^{-1}$ to about $10^{-10}$ $(\Omega\text{-cm})^{-1}$ and an illumination conductivity of about $10^{-5}$ $(\Omega\text{-cm})^{-1}$.

19. An integrated circuit, comprising:
    a semiconductor substrate;
    a plurality of transistors, at least one of said transistors having semiconductor features located over said substrate; and
    an insulating photoconductive layer coupling said semiconductor features, said photoconductive layer configured to provide conductivity between said semiconductor features in a presence of a plasma.

20. The integrated circuit as recited in claim 19 wherein a thickness of said photoconductive layer ranges from about 15 nm to about 4 nm.

21. The integrated circuit as recited in claim 19 wherein said semiconductor features are a gate, source and drain.

22. The integrated circuit as recited in claim 21 wherein a silicide layer is located between said photoconductive layer and said source and drain.

23. The integrated circuit as recited in claim 19 wherein said semiconductor features are metal features on a metal level of said semiconductor device.

24. The integrated circuit as recited in claim 19 wherein said photoconductive layer couples a plurality of said plurality of transistors.

25. The integrated circuit as recited in claim 19 wherein said photoconductive layer has a band gap ranging from about 1.2 eV to about 6.0 eV.

26. The integrated circuit as recited in claim 19 wherein said photoconductive layer comprises amorphous silicon.

27. The integrated circuit as recited in claim 19 wherein said photoconductive layer comprises one selected from the group comprising:

gallium nitride, boron nitride, and silicon carbide.

28. The integrated circuit as recited in claim 19 wherein said photoconductive layer has a dark conductivity ranging from about $10^{-11}$ $(\Omega\text{-cm})^{-1}$ to about $10^{-10}$ $(\Omega\text{-cm})^{-1}$ and an illumination conductivity of about $10^{-5}$ $(\Omega\text{-cm})^{-1}$.

* * * * *